United States Patent
Keane

(10) Patent No.: US 6,256,878 B1
(45) Date of Patent: *Jul. 10, 2001

(54) IC CARD HOUSING AND METHOD OF MANUFACTURE

(75) Inventor: Mike Keane, Galway (IE)

(73) Assignee: Molex Incorporated, Lisle, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/161,820

(22) Filed: Sep. 28, 1998

(30) Foreign Application Priority Data

Jun. 8, 1998 (EP) .................................................. 98110487

(51) Int. Cl.⁷ ...................................................... H05K 3/30
(52) U.S. Cl. ............................. 29/841; 29/832; 361/719; 361/720; 361/721
(58) Field of Search ............................. 29/840, 841, 842, 29/825, 832; 361/719, 720, 721

(56) References Cited

U.S. PATENT DOCUMENTS

| | | |
|---|---|---|
| 5,207,586 * | 5/1993 | MacGregor et al. . |
| 5,242,310 * | 9/1993 | Leung . |
| 5,330,360 * | 7/1994 | Marsh et al. . |
| 5,339,222 * | 8/1994 | Simmons et al. . |
| 5,397,857 | 3/1995 | Farquhar et al. .................... 174/52.1 |
| 5,475,919 | 12/1995 | Wu et al. ................................ 29/841 |
| 5,476,387 * | 12/1995 | Ramey et al. . |
| 5,490,891 | 2/1996 | Farquhar et al. .................... 156/73.1 |
| 5,574,628 | 11/1996 | Persia et al. .......................... 361/737 |

* cited by examiner

*Primary Examiner*—Carl J. Arbes
(74) *Attorney, Agent, or Firm*—A. A. Tirva; Stacey E. Caldwell

(57) ABSTRACT

A method is provided for manufacturing a housing for containing an IC card. The method includes the steps of stamping a pair of metal covers with at least one of the covers having a continuous uninterrupted edge provided with a plurality of through holes spaced inwardly of and along the edge. The covers are placed into a mold for an injection molding process. Plastic support members are injected into the mold into attachment with the covers. Plastic material of the support member surrounds the edge and flows through the holes of the cover. The covers and attached support members are removed from the mold, and the support members are bonded together so that a housing is formed with the covers and within which the IC card can be contained.

11 Claims, 3 Drawing Sheets

IC CARD HOUSING AND METHOD OF MANUFACTURE

FIELD OF THE INVENTION

This invention generally relates to the art of IC cards and, particularly, to a housing for containing an IC card and a method of manufacturing the housing.

BACKGROUND OF THE INVENTION

Generally, IC cards or packs, such as memory cards, are data input devices which are electrically connected to an electronic apparatus or storage device, such as a word processor, personal computer or other electronic apparatus. The IC cards include printed circuit boards and can expand the capacity of a personal computer, for instance. Generally, the IC card is in the form of a printed circuit board contained within an outer housing and can be inserted into or "plugged-in" and extracted from a connector device on the electronic apparatus.

A typical IC or memory card is shielded by a conductive cover to protect the electrical circuitry and, in particular, the electromagnetic signals from externally generated radiated emissions. The card also is provided with EMI or grounding systems to minimize the effects of electromagnetic pulses created during the dissipation of static charges through the signal contacts. With the use of such IC or memory cards in a wide variety of computer applications, the Personal Computer Memory Card International Association (PCMCIA) has established certain standards for the design of IC cards in their housings or containers.

For instance, a printed circuit board must be sealed within a rigid container for insertion into a computer. With the IC card having to be shielded, a typical container or housing is formed by a pair of generally planar metal covers secured to a generally rectangular plastic housing surrounding the printed circuit board or IC card, with the card sandwiched between the metal covers. A continuing problem with such constructions centers around adequate bonding or attachment between the metal covers and the plastic frame. The present invention is particularly directed to solving these problems.

Still further, chip cards are used in a variety of applications and comprise a card of approximately the same size as a standard credit card. The card, itself, contains intelligence in the form of a memory circuit. A card reader is used to detect certain information stored on the card. One such chip card is identified as a "Subscriber's Identification Module" or "SIM" which is a miniature chip card which provides user identification. The SIM card reader provides quick identification of the user.

The use of SIM cards in conjunction with IC or memory cards has become increasingly important. For instance, it has become desirable to provide security for mass memory cards for personal computers. Because of their considerably capacity, the computers can contain significant data bases which should be protected, or expensive programs which should not be used or duplicated without authorization. In addition, they can be used for performing confidential transactions which should not be accessed. Therefore, the chip or SIM card is used to protect the IC or memory card, and the memory card, therefore, includes a card reader to provide quick identification of the user.

The present invention is disclosed herein in a housing for containing an IC card, but the apparatus also functions as an adapter which includes a card reader connector and receptacle means for receiving a miniature chip or SIM card. However, it should be understood that the invention is not limited to such a structural combination.

SUMMARY OF THE INVENTION

An object, therefore, of the invention is to provide a new and improved method of manufacturing a housing for containing an IC card, as well as the new and improved housing, itself.

Generally, the invention is directed to a method which includes the steps of stamping a pair of metal covers and placing the covers into a mold for an injection molding process. Plastic support members are injected into the mold into attachment with the covers. The covers and the attached support members are removed from the mold. The plastic support members are bonded together so that a housing is formed with the covers and within which the IC card can be contained.

According to one aspect of the invention, at least one of the covers has a planar edge provided with open areas. During the injection molding process, the plastic material of the support members surround the planar edge and flow into the open areas.

According to another aspect of the invention, at least one of the covers has a continuously uninterrupted edge provided with a plurality of through holes spaced inwardly of and along the edge. During the injection molding process, the plastic material of the support member surrounds the continuous uninterrupted edge and flow through the holes.

As disclosed herein, at least one of the covers is stamped with continuous uninterrupted edges along opposite longitudinal sides thereof. A plurality of the through holes are spaced inwardly of and along each edge. Again, the plastic material of the support member surrounds both edges and flows through the holes therealong.

The invention also is directed to a housing for containing an IC card, the housing being fabricated according to the above method.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
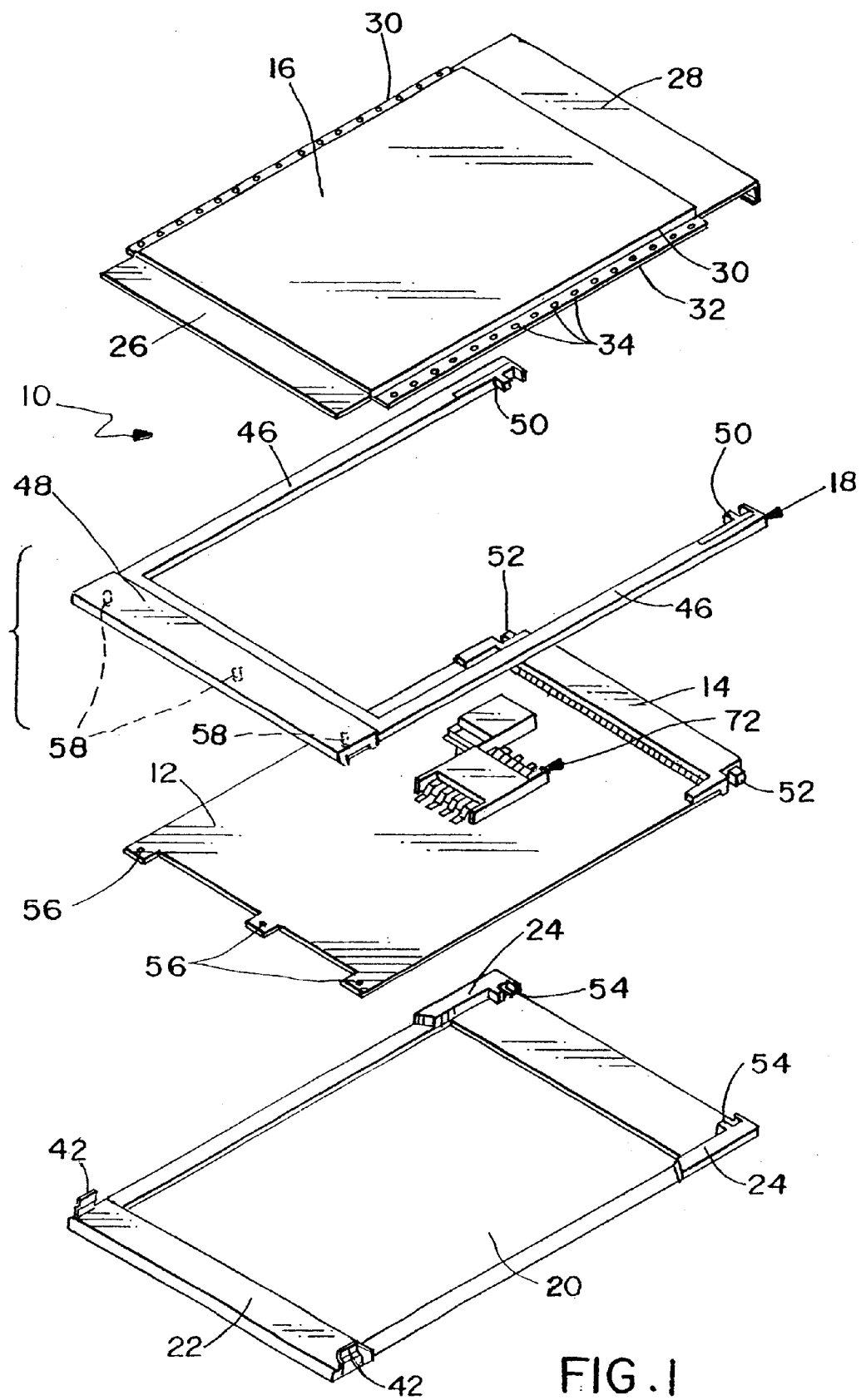
FIG. 1 is an exploded perspective view of the components of a housing for containing an IC card, according to the invention.

Referring to the drawings in greater detail, and first to FIG. 1, the invention is embodied in a housing, generally designated 10, for containing an IC or memory card shown as a printed circuit board 12. The housing surrounds the printed circuit board to form a memory card package which can be "plugged-in" to a variety of electronic apparatus, such as a personal computer. To that end, an elongated connector 14 is secured to the front edge of circuit board 12 and, as is known in the art, terminals of the connector are interconnected to circuit traces on the board. Therefore, the memory card package, through connector 14, can be plugged into the appropriate electronic apparatus.

Figure 2:
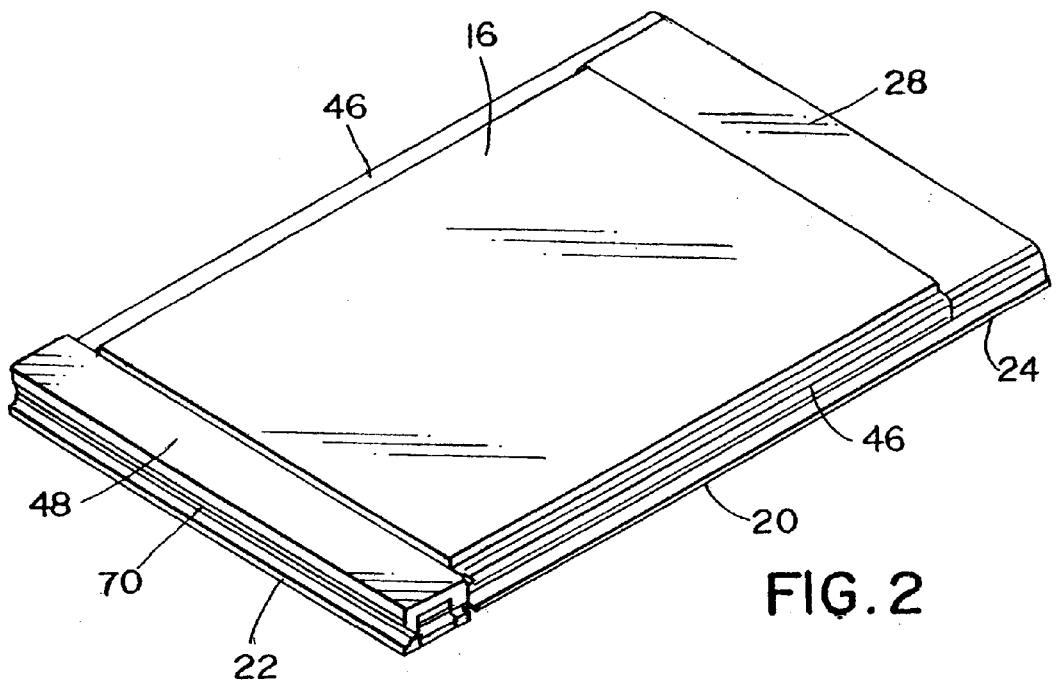
FIG. 2 is a perspective view of the housing in fully assembled condition.

Housing 10 includes a top metal cover 16 attached to a generally U-shaped upper plastic support member, generally designated 18. A bottom metal cover 20 is attached to a rear lower plastic support member 22 and a pair of front lower plastic support members 24. Rear plastic support member 22 can be seen running along the rear edge of bottom metal cover 20, whereas front plastic support members 24 are located at the front corners of the bottom metal cover. In assembly, support members 18, 22 and 24, along with their attached metal covers, are bonded together to sandwich printed circuit board 12 and connector 14 therebetween as shown in FIG. 2 and described in greater detail hereinafter.

Figure 3:
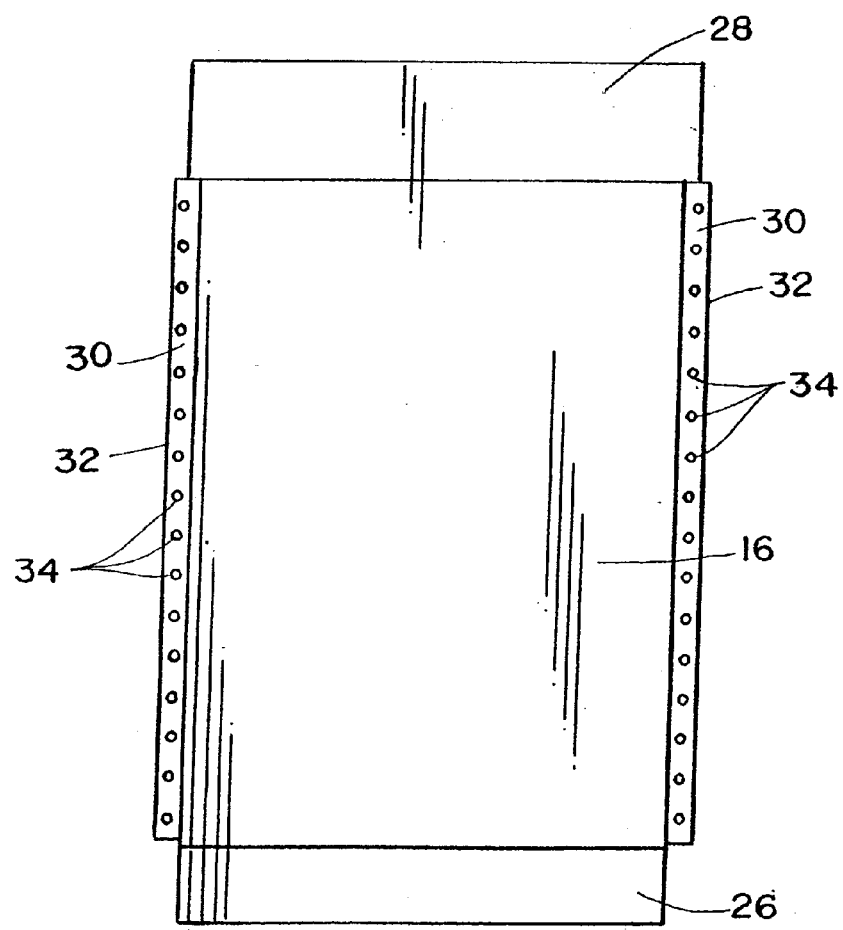
FIG. 3 is a top plan view of the top metal cover.

More particularly, top metal cover 16 of housing 10 is stamped of sheet metal material to include a rear lip 26, a front lip 28 and a pair of opposite side flanges 30 running longitudinally of the cover between the rear and front lips thereof. As seen in FIG. 3 in conjunction with FIG. 2, each side flange 30 has a continuous uninterrupted edge 32 and is provided with a plurality of through holes 34 spaced inwardly of and along the edge. During stamping, rear lip 26, front lip 28 and side flanges 30 are slightly offset from the plane of top cover 16.

Figure 4:
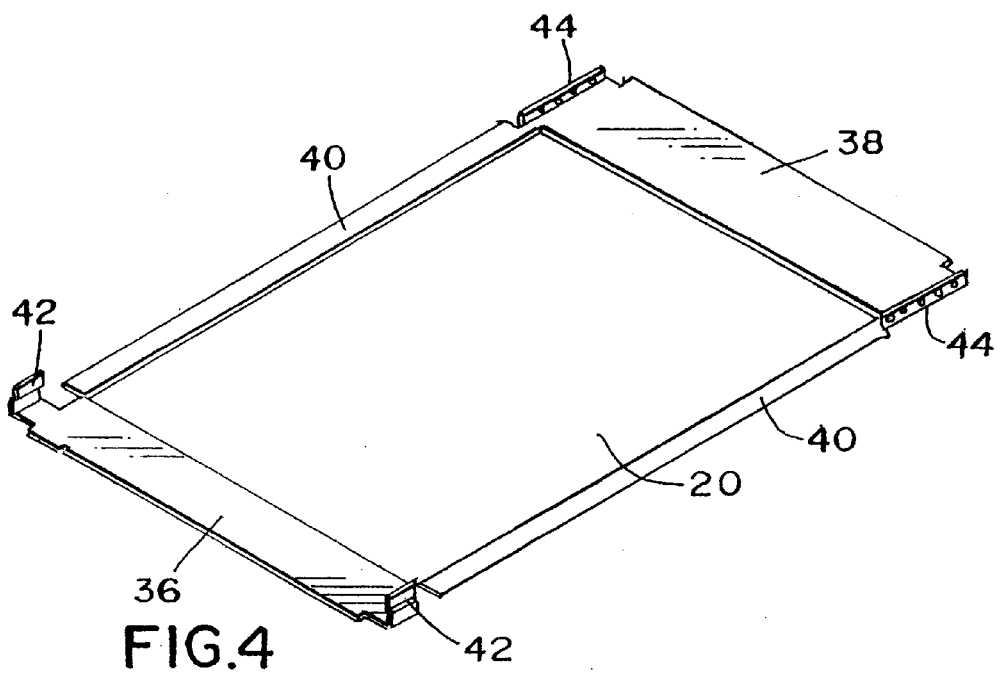
FIG. 4 is a perspective view of the bottom metal cover.

Referring to FIG. 4 in conjunction with FIG. 1, bottom metal cover 20 also is stamped from sheet metal material and includes a rear lip 36, a front lip 38 and opposite side flanges 40. A securing tab 42 projects upwardly (or inwardly) from each opposite end of rear lip 36. An attachment flange 44 projects upwardly (or inwardly) from each opposite end of front lip 38. Each attachment flange 44 is similar to side flanges 30 of top metal cover 16, in that each of the flanges has a continuous uninterrupted edge provided with a plurality of through holes spaced inwardly of an along the edge.

Upper plastic support member 18 is overmolded about portions of top metal cover 16 during an injection molding process described hereinafter. Therefore, it should be understood that support member 18 is never separated from top metal cover 16 as shown in FIG. 1. This depiction is solely for the purposes of understanding the structural details of plastic support member 18.

With that understanding, support member 18 is generally U-shaped and includes a pair of opposite side legs 46 joined by a cross support 48. The underside of the cross support is molded with a pair of narrow slots (FIG. 5) for receiving securing tabs 42 of bottom metal cover 20. The distal ends of side legs 46 are provided with generally U-shaped yokes 50.

During manufacture, stamped metal top cover 16 is placed into an appropriate mold for an injection molding process. Plastic support member 18 then is injection molded into the configuration described above. During the injection molding process, cross support 48 of the support member is overmolded about rear lip 26 of the top metal cover. Side legs 46 of the upper support member are overmolded about side flanges 30 of the top cover. The plastic material surrounds the continuous uninterrupted edges 32 of the side flanges and flows through holes 34 to provide a solid overmolded attachment between the top metal cover and the upper plastic support member.

Similarly, bottom metal cover 20 (FIG. 4) is placed into an appropriate mold for an injection molding process. Rear support member 22 is overmolded about rear lip 36 of the bottom metal cover, and front support members 24 are overmolded about side flanges 44 of the bottom metal cover. As with the plastic material of side legs 46 of upper support member 18 and side flanges 30 of top metal cover 16, the plastic material of front support members 24 surrounds the continuous uninterrupted edges of attachment flanges 44 and flows through the holes in the attachment flanges to provide a solid overmolded attachment between bottom metal cover 20 and support members 24. As seen in FIG. 1, front support members 24 have generally U-shaped yokes 54 for embracing positioning bosses 52 of connector 14.

Figure 6:
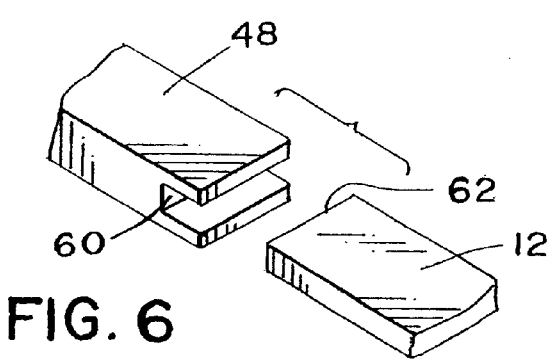
FIG. 6 is a fragmented perspective view of an alternate interface between the rear edge of the printed circuit board and the upper cover support member.

After overmolding support members 18, 22 and 24 onto their respective metal covers 16 and 20, printed circuit board 12 and connector 14 are mounted on one of the overmolded assemblies. To that end, the rear edge of the printed circuit board is provided with three apertured tabs 56 which are positioned to correspond to three positioning posts 58 which, in the embodiment shown in FIG. 1, project downwardly from cross support 48 of upper support member 18 as shown by the phantom lines extending from cross support 48 in FIG. 1. Referring to FIG. 6, an alternative arrangement would be to provide a front edge of support member 18 with a slot or groove 60 for receiving a continuous, uninterrupted rear edge 62 of printed circuit board 12.

Figure 5:
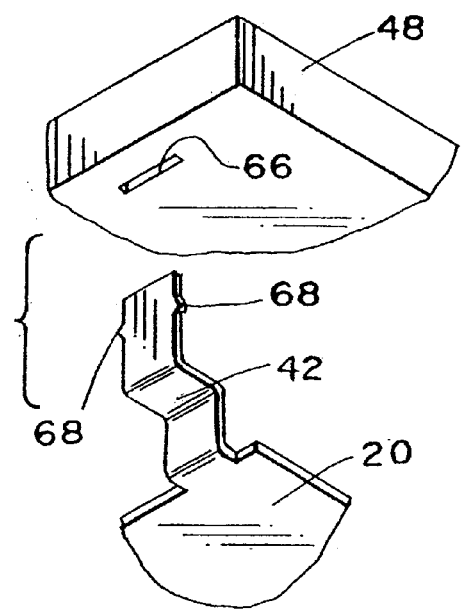
FIG. 5 is a fragmented perspective view of the interengagement at the rear corners of the bottom cover and the upper plastic support member.

After printed circuit board 12 and connector 14 are positioned on the overmolded assembly of top metal cover 16 and upper support member 18, the overmolded assembly of top cover 16 and upper support member 18 is positioned so that yokes 50 of the upper support member embrace positioning boss 52 of the connector, and cross support 48 of the upper support member overlies rear support member 22. As seen in FIG. 5, securing tabs 42 of bottom metal cover 20 are inserted into slots 66 on the underside of cross support 48. The securing tabs include side barbs 68 which establish a solid press fit of the securing tabs within the slots.

The distal ends of side legs 46 of upper support member 18 then are ultrasonically welded to the tops of front support members 24 to form the final assembly as shown in FIG. 2. When finally assembled, front lip 28 of top metal cover 16 (FIG. 1) and front lip 38 (FIG. 4) of bottom metal cover 20 sandwich and shield connector 14. Also in the final assembly as shown in FIG. 2, an open slot 70 is formed between cross support 48 of the upper support member and rear support member 22 for receiving an identification or SIM card therethrough. As seen in FIG. 1, a card reader connector, generally designated 72, is mounted on the top of printed circuit board 12 and is appropriately connected electrically to circuit traces on printed circuit board 12. Therefore, the IC card provided by circuit board 12 and connector 14 also functions as a card reader for an identification card inserted through slot 70.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A method of manufacturing a housing for containing an IC card, comprising the steps of:

stamping a pair of metal covers with at least one of the covers having a continuous uninterrupted edge provided with a plurality of through holes spaced inwardly of and along the edge;

placing the covers into mold means for an injection molding process;

injecting plastic support members into attachment with the covers, with plastic material of the support members surrounding said edges and flowing through said holes;

removing the covers and attached support members from the mold; and bonding the plastic support members together so that a housing is formed with the covers and within which the IC card can be contained.

2. The method of claim 1 wherein said bonding step includes ultrasonically welding at least portions of the support members together.

3. The method of claim 1 wherein at least one of the covers is stamped with continuous uninterrupted edges along opposite longitudinal sides thereof with a plurality of said through holes spaced inwardly of and along each edge.

4. The method of claim 1, including the step of positioning a printed circuit board between the covers before bonding the plastic support members together.

5. The method of claim 4 wherein said printed circuit board is positioned on one of the plastic support members.

6. A method of manufacturing a housing for containing an IC card, comprising the steps of:

stamping a rigid metal cover with a continuous uninterrupted edge provided with a plurality of through holes spaced inwardly of and along the edge;

placing the cover into a mold for an injection molding process; and injecting a plastic support member into the mold into attachment with the cover, with plastic material of the support member surrounding said edge and flowing through said holes.

7. The method of claim 6 wherein said cover is stamped with continuous uninterrupted edges along opposite sides thereof with a plurality of said through holes spaced inwardly of and along each edge.

8. The method of claim 6, including the step of positioning a printed circuit board beneath the cover and in attachment with the plastic support member.

9. A method of manufacturing a housing for containing an IC card, comprising the steps of:

stamping a metal cover with a generally planar edge having open areas there along;

placing the cover into a mold for an injection molding process; and injecting a plastic support member into the mold into attachment with the cover, with plastic material of the support member surrounding said planar edge and flowing into said open areas.

10. The method of claim 9 wherein said cover is stamped with planar edges along opposite sides thereof with a plurality of said open areas along each edge.

11. The method of claim 9, including the step of positioning a printed circuit board beneath the cover and in attachment with the plastic support member.

* * * * *